(12) United States Patent
Iijima et al.

(10) Patent No.: US 7,138,297 B2
(45) Date of Patent: Nov. 21, 2006

(54) METHOD OF DIVIDING A SEMICONDUCTOR WAFER UTILIZING A LASER DICING TECHNIQUE

(75) Inventors: Toshitsune Iijima, Tama (JP); Ninao Sato, Mitaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 10/918,412

(22) Filed: Aug. 16, 2004

(65) Prior Publication Data

US 2005/0017326 A1    Jan. 27, 2005

Related U.S. Application Data

(62) Division of application No. 10/418,274, filed on Apr. 18, 2003, now Pat. No. 7,091,624.

(30) Foreign Application Priority Data

Jan. 14, 2003    (JP) .............................. 2003-006387

(51) Int. Cl.
*H01L 21/48* (2006.01)
*H01L 23/544* (2006.01)

(52) U.S. Cl. ...................... 438/113; 438/462; 438/463; 257/797

(58) Field of Classification Search ...................... None
See application file for complete search history.

(56) References Cited

U.S. PATENT DOCUMENTS

| 5,430,325 A | 7/1995 | Sawada et al. | 257/618 |
| 5,684,333 A * | 11/1997 | Moriyama | 257/797 |
| 5,716,889 A * | 2/1998 | Tsuji et al. | 438/401 |
| 5,777,392 A * | 7/1998 | Fujii | 257/797 |
| 5,899,729 A | 5/1999 | Lee | 438/460 |
| 6,005,294 A * | 12/1999 | Tsuji et al. | 257/797 |
| 6,287,895 B1 | 9/2001 | Sato | 438/114 |
| 6,737,300 B1 | 5/2004 | Ding et al. | 438/110 |
| 6,809,002 B1 * | 10/2004 | Yabe et al. | 438/401 |
| 6,878,506 B1 * | 4/2005 | Tsubata | 430/311 |
| 7,091,624 B1 * | 8/2006 | Iijima et al. | 257/797 |

FOREIGN PATENT DOCUMENTS

| JP | 10-22237 | 1/1998 |
| JP | 2002176140 A * | 6/2002 |
| JP | 2002-192367 | 7/2002 |

* cited by examiner

*Primary Examiner*—Alonzo Chambliss
(74) *Attorney, Agent, or Firm*—Finnegan, Henderson, Farabow, Garrett & Dunner, L.L.P.

(57) ABSTRACT

A semiconductor chip is formed by dividing a semiconductor wafer by use of the laser dicing technique. The semiconductor chip has a laser dicing region on the side surface thereof. A dummy wiring layer is formed along the laser dicing region on the surface layer of the laser dicing region. A laser beam is applied to the dummy wiring layer to divide the semiconductor wafer.

9 Claims, 6 Drawing Sheets

METHOD OF DIVIDING A SEMICONDUCTOR WAFER UTILIZING A LASER DICING TECHNIQUE

This application is a divisional of application Ser. No. 10/418,274, filed Apr. 18, 2003 now U.S. Pat. No. 7,091,624 upon which this application claims the benefits provided in 35 U.S.C. § 120.

CROSS-REFERENCE TO RELATED APPLICATIONS

This application is based upon and claims the benefit of priority from the prior Japanese Patent Application No. 2003-006387, filed Jan. 14, 2003, the entire contents of which are incorporated herein by reference.

BACKGROUND OF THE INVENTION

1. Field of the Invention

This invention relates to a semiconductor device and a manufacturing method thereof and more particularly to a laser dicing technique for applying a laser beam to divide a semiconductor wafer into, discrete chips.

2. Description of the Related Art

It is predicted that a microprocessor now used is required to process a further larger amount of information at high speed in future. So far, miniaturization of transistors determines the performance of the microprocessor. However, in recent years, RC delay (R: Resistance, C: Capacitance) causes a problem and much importance is given not only to miniaturization of transistors but also to parasitic capacitance (capacitance between wirings arranged with an insulating material disposed therebetween) and resistance of wirings which connect transistors to one another.

In order to suppress the RC delay, it becomes necessary to change a wiring material from Al to Cu and use a material with a small dielectric constant instead of a silicon oxide film as an insulating material. However, the insulating film with the small dielectric constant generally has a porous structure and since the low dielectric property is acquired by virtue of the structure, the mechanical strength and adhesion strength thereof are extremely low in comparison with those of the silicon oxide film. Therefore, when a semiconductor wafer is diced into discrete chips, layer-layer separation tends to occur if the insulating film with the small dielectric constant is mechanically cut. Further, since the Cu wiring (or copper conductor) is formed of a material having relatively high viscosity, film separation tends to occur if a normal blade dicing process is performed.

Therefore, much attention is paid to laser dicing instead of the conventional blade dicing. In the laser dicing, a laser beam with high energy is applied to melt and cut a semiconductor wafer. Therefore, it is expected that the cutting property of the Cu wiring and insulating film with the small dielectric constant can be significantly enhanced in comparison with the grinding method such as the conventional blade dicing.

As the laser dicing, the following two methods are considered. The laser dicing methods are described in Jpn. Pat. Appln. KOKAI Publication No. 2002-192367, for example. The first method is to apply a laser beam after focusing the laser beam on the uppermost layer by use of a lens (condenser lens) 11 as shown in FIG. 1 and melt and cut a wafer 12 together with a circuit element layer 13. The second method is to set the focusing position of a laser beam on the internal portion of the wafer 12 to form a melt processing region 16 due to multiphoton absorption as shown in FIG. 2 and then discretely divide the wafer 12 by stretching a dicing film 15.

Since the first method requires extremely large laser power when the thick wafer 12 is cut, larger damages will be applied to the wafer in comparison with a case of the blade dicing method in some cases. Therefore, the first method is suitable for a process of cutting only the circuit element layer 13 on the surface layer by use of relatively low laser energy, for example.

Since the second method is to divide the wafer 12 starting from the melt processing region 16, it can cope with the relatively thick wafer 12. However, since insulating films and wiring layers (or inter-connections) are arranged in a complex form in the wiring pattern of the circuit element layer 13 on the surface layer, there occurs a possibility that unexpected destruction such as separation of the insulating film and layer-layer separation of the wiring layers will occur at the time of dividing Particularly, there occurs a strong possibility that insulating films with small dielectric constant which are recently actively used will be destroyed at the time of dividing because of characteristics such as the low mechanical strength and low adhesion strength thereof.

That is, in the laser dicing, the surface state of a finished to-be-cut member is largely influenced. More specifically, if focusing and power adjustment are made on a region in which metal wiring layers are present and the wafer is cut, large damage is given to a region in which no metal wiring layers are present and film separation occurs in the worst case. Particularly, when a plurality of transparent films which permit the laser beam to pass therethrough are laminated on a dicing line region, the damage becomes significant. On the other hand, if focusing and power adjustment are made on a region in which no metal wiring layers are present, there occurs a possibility that the metal wiring layer cannot be cut in some cases.

Therefore, when the laser dicing is performed, it is required to finely adjust a laser dicing device according to the surface state of a to-be-cut member. However, since patterns of metal wiring layers such as alignment marks and test pads are arranged in a complicated form in the dicing line region of the actual semiconductor wafer, it is difficult to adjust and set the laser dicing device into an optimum state.

As described above, the conventional semiconductor device and the manufacturing method thereof have a problem that the surface state of a finished to-be-cut member is influenced when the laser dicing is performed, the quality is lowered and the cutting property and manufacturing yield are lowered.

BRIEF SUMMARY OF THE INVENTION

A method of manufacturing a semiconductor device according to an aspect of the present invention comprises applying a laser bean to a semiconductor wafer an alignment mark and testing pads formed in each region between semiconductor chips of the semiconductor wafer, and dividing the semiconductor wafer into discrete semiconductor chips.

A method of manufacturing a semiconductor device according to another aspect of the present invention comprises focusing a laser beam on a surface layer side of a dicing line region, applying a laser beam to a semiconductor wafer except an alignment mark and testing pads formed in each region between semiconductor chips to form a cut region shallower than thickness of the semiconductor wafer, focusing a laser beam on a deep layer side of the semiconductor wafer corresponding in position to the cut region, applying a laser beam to the semiconductor wafer except the alignment mark and testing pads formed in each region between the semiconductor chips to form a melt processing region due to multiphoton absorption in the semiconductor wafer, and dividing the semiconductor wafer into discrete semiconductor chips.

A method of manufacturing a semiconductor device according to still another aspect of the present invention comprises applying a laser beam focused on a surface layer side of a dicing line region to a semiconductor wafer except an alignment mark and testing pads formed in each region between semiconductor chips of the semiconductor wafer and applying a laser beam focused on an internal portion of the semiconductor wafer to the semiconductor wafer except the alignment mark and testing pads formed in each region between the semiconductor chips of the semiconductor wafer to form a cut region on the surface layer side of the semiconductor wafer and a melt processing region due to multiphoton absorption on the deep layer side of the semiconductor wafer, and dividing the semiconductor wafer into discrete semiconductor chips.

DETAILED DESCRIPTION OF THE INVENTION

[First Embodiment]

Figure 1:
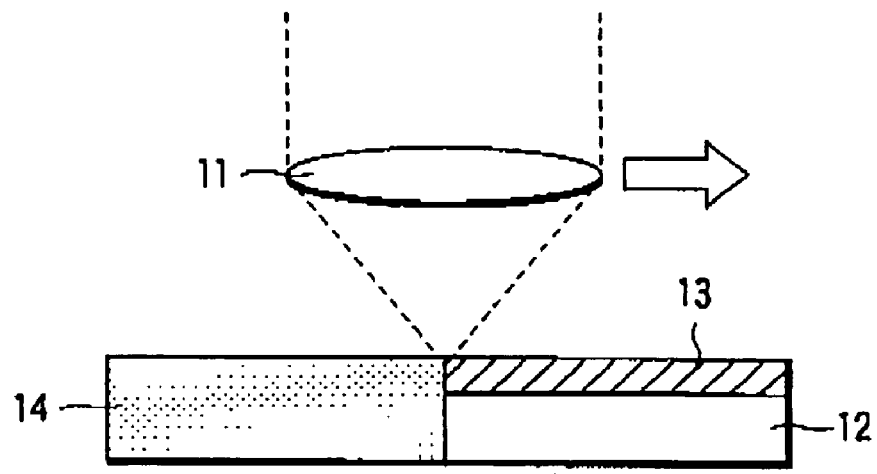
FIG. 1 is a cross sectional view showing a laser dicing step of a first method, for illustrating a conventional semiconductor device and a manufacturing method thereof.
Figure 2:
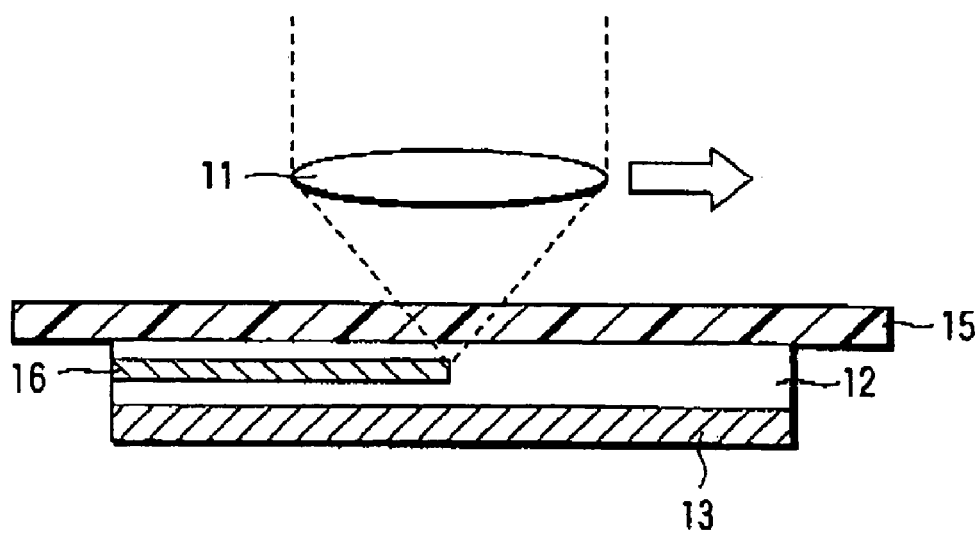
FIG. 2 is a cross sectional view showing a laser dicing step of a second method, for illustrating a conventional semiconductor device and a manufacturing method thereof.
Figure 3:
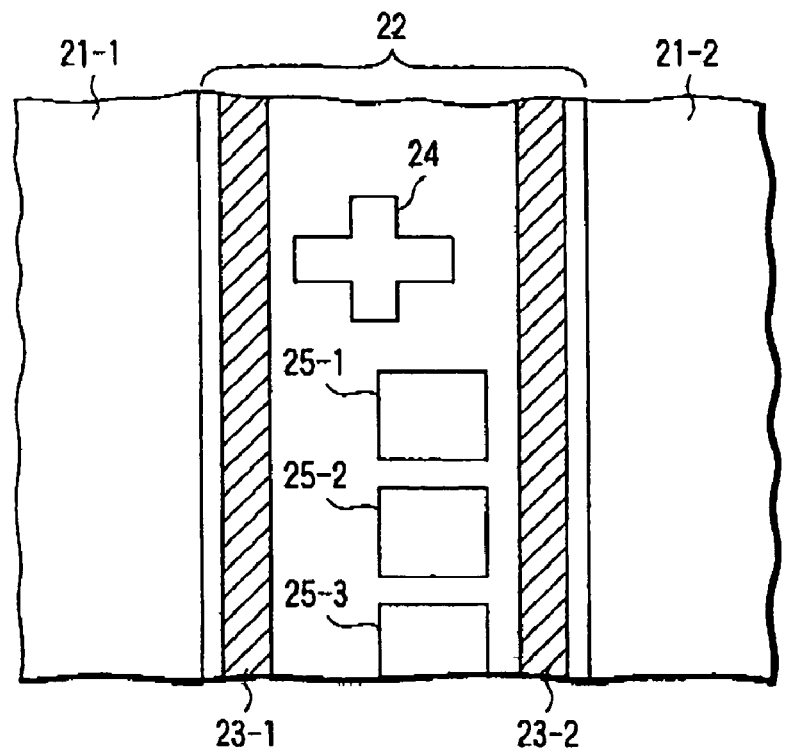
FIG. 3 is an enlarged pattern plan view showing two chips formed close to each other in a semiconductor wafer and a region between the two chips, for illustrating a semiconductor device and a manufacturing method thereof according to a first embodiment of the present invention.

FIG. 3 shows two chips (semiconductor chips) 21-1, 21-2 which are formed close to each other in a semiconductor wafer and a region 22 between the chips 21-1 and 21-2 in an enlarged form, for illustrating a semiconductor device and a manufacturing method thereof according to a first embodiment of the present invention. In a portion near the central portion of the region 22, an alignment mark 24 and test pads 25-1, 25-2, 25-3 are arranged. Further, laser dicing regions 23-1, 23-2 are straightly arranged along the outer peripheries of the respective chips 21-1, 21-2 to avoid the alignment mark 24 and test pads 25-1, 25-2, 25-3. Wiring layers are respectively formed on the front surface layers of the laser dicing regions 23-1, 23-2. The wiring layers are not used to make an electrical connection but used as dummy patterns (dummy wiring layers) which make laser beam application regions uniform and permit the laser beam to be easily absorbed. For example, the dummy wiring layer is formed by using the same layer as metal wiring layers used in element regions of the chips 21-1, 21-2 together with the alignment mark 24 and test pads 25-1, 25-2, 25-3.

When the semiconductor wafer is divided into the discrete chips 21-1, 21-2, a laser beam is applied onto the laser dicing regions (metal wiring layers) 23-1, 23-2 to melt and cut the laser dicing regions. At the time of melting and cutting, the focusing position of the laser beam is set on the uppermost layer by use of a lens and the laser beam is applied to melt and cut the wafer.

Further, after the focusing position of the laser beam is set on the internal portion of the wafer and the laser beam is applied to form a melt processing region due to multiphoton absorption, the wafer can be divided into discrete chips by cracking or stretching a dicing film.

With the above configuration and manufacturing method, since the metal wiring layers are formed on the laser dicing regions 23-1, 23-2 and the surface states thereof are uniform, the quality of the finished product will not vary. Further, since the dummy wiring layer (metal wiring layer) tends to absorb the laser beam, the cutting property in the laser dicing step can be improved. Of course, since the wafer is divided by melting, there is no possibility that chippings occurring in the dicing step in which a mechanical grinding process using a blade is performed will occur. Further, focusing and power adjusting of the laser dicing device can be easily attained. In addition, since the alignment mark 24, test pads 25-1, 25-2, 25-3 and dummy wiring layers are formed by use of the same layer as the metal wiring layers used in the element regions in the chips 21-1, 21-2, it is only necessary to change the design of a mask used to form a pattern of the metal wiring layers of the element regions. Therefore, the manufacturing process will not be complicated and the manufacturing cost will not rise.

When the metal wiring layers are not present under the laser dicing regions 23-1, 23-2, the same effect can be attained if straight metal wiring layers are not forcibly arranged on the uppermost layers.

[Second Embodiment]

Figure 4:
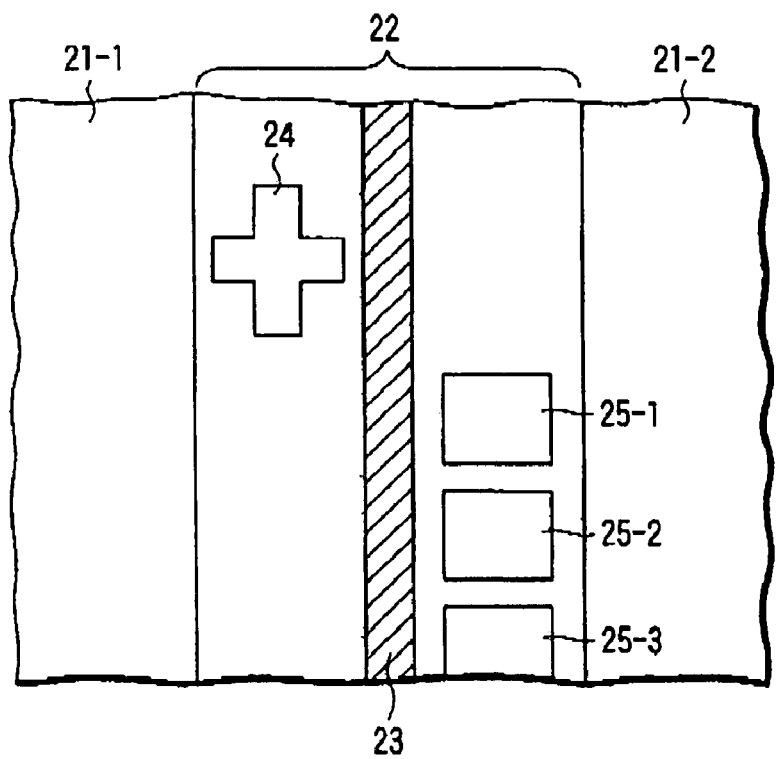
FIG. 4 is an enlarged pattern plan view showing two chips formed close to each other in a semiconductor wafer and a region between the two chips, for illustrating a semiconductor device and a manufacturing method thereof according to a second embodiment of the present invention.

FIG. 4 shows two chips (semiconductor chips) 21-1, 21-2 which are formed close to each other in a semiconductor wafer and a region 22 between the two chips 21-1 and 21-2 in an enlarged form, for illustrating a semiconductor device and a manufacturing method thereof according to a second embodiment of the present invention. On the chip 21-1 side and the chip 21-2 side of the region 22, an alignment mark 24 and test pads 25-1, 25-2, 25-3 are respectively arranged. Further, a laser dicing region 23 is straightly arranged in a portion near the central portion of the region 22 to avoid the alignment mark 24 and test pads 25-1, 25-2, 25-3. A wiring layer is formed on the front surface layer of the laser dicing region 23. The wiring layer is not used to make an electrical connection but used as a dummy pattern (dummy wiring layer) which makes a laser beam application region uniform and permits the laser beam to be easily absorbed. For example, the dummy wiring layer is formed by using the same layer as metal wiring layers used in element regions of the chips 21-1, 21-2 together with the alignment mark 24 and test pads 25-1, 25-2, 25-3.

When the semiconductor wafer is divided into the discrete chips 21-1, 21-2, a laser beam is applied onto the laser dicing region (metal wiring layer) 23 to melt and cut the laser dicing region. At the time of melting and cutting, the focusing position of the laser beam is set on the uppermost layer by use of a lens and the laser beam is applied to melt and cut the wafer. Further, after the focusing position of a laser beam is set on the internal portion of the wafer and the laser beam is applied to form a melt processing region due to multiphoton absorption, the wafer can be divided into discrete chips by cracking or stretching a dicing film.

With the above configuration and manufacturing method, since the dummy wiring layer (metal wiring layer) is formed on the uppermost layer of the laser dicing region 23 and the surface state thereof is uniform, the quality of the finished product will not vary. Further, since the metal wiring layer tends to absorb the laser beam, the cutting property in the laser dicing step can be improved. Of course, since the wafer is divided by melting, there is no possibility that chippings occurring in the dicing step in which a mechanical grinding process using a blade is performed will occur. Further, focusing and power adjusting of the laser dicing device can be easily attained. In addition, since the alignment mark 24, test pads 25-1, 25-2, 25-3 and dummy wiring layer are formed by use of the same layer as the metal wiring layers used in the element regions in the chips 21-1, 21-2, it is only necessary to change the design of a mask used to form a pattern of the metal wiring layers of the element regions. Therefore, the manufacturing process will not be complicated and the manufacturing cost will not rise.

When the metal wiring layer is not present under the laser dicing region 23, the same effect can be attained if a straight metal wiring layer is not forcibly arranged on the uppermost layer.

[Third Embodiment]

Figure 5:
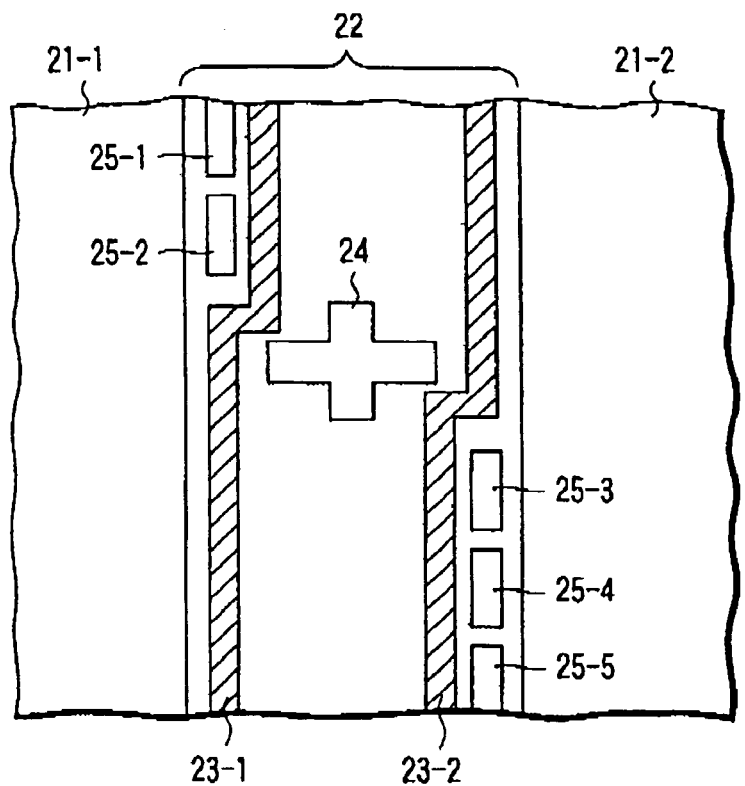
FIG. 5 is an enlarged pattern plan view showing two chips formed close to each other in a semiconductor wafer and a region between the two chips, for illustrating a semiconductor device and a manufacturing method thereof according to a third embodiment of the present invention.

FIG. 5 shows two chips (semiconductor chips) 21-1, 21-2 which are formed close to each other in a semiconductor wafer and a region 22 between the two chips 21-1 and 21-2 in an enlarged form, for illustrating a semiconductor device and a manufacturing method thereof according to a third embodiment of the present invention. In the third embodiment, in a case where it is difficult to shift an alignment mark 24 or test pads 25-1 to 25-5, laser dicing regions (metal wiring layers) 23-1, 23-2 are adequately bent and arranged to avoid the arranged mark and pads.

A laser dicing device can freely move the application position of a laser beam in XY directions. Therefore, when the semiconductor wafer is divided into the discrete chips 21-1, 21-2, a laser beam is applied onto the bent metal wiring layers to melt and cut the laser dicing regions. Further, after the focusing position of a laser beam is set on the internal portion of the wafer and the laser beam is applied to form a melt processing region due to multiphoton absorption, the wafer can be divided into discrete chips by cracking or stretching a dicing film.

With the above configuration and manufacturing method, since the dummy wiring layers (metal wiring layers) are formed on the laser dicing regions 23-1, 23-2 and the surface states thereof are uniform, the quality of the finished product will not vary. Further, since the metal wiring layer tends to absorb the laser beam, the cutting property in the laser dicing step can be improved. Of course, since the wafer is divided by melting, there is no possibility that chippings occurring in the dicing step in which a mechanical grinding process using a blade is performed will occur. Further, focusing and power adjusting of the laser dicing device can be easily attained. In addition, since the alignment mark 24, test pads 25-1 to 25-5 and dummy wiring layers are formed by use of the same layer as the metal wiring layers used in the element regions in the chips 21-1, 21-2, it is only necessary to change the design of a mask which is used to form a pattern of the metal wiring layers of the element regions. Therefore, the manufacturing process will not be complicated and the manufacturing cost will not rise.

When the metal wiring layers are not present under the laser dicing regions 23-1, 23-2, it is not necessary to forcibly arrange the bent wiring layers on the uppermost layers.

A case wherein the two dicing line regions are bent and arranged is explained as an example, but it is of course possible to bend and arrange one dicing line region.

[Fourth Embodiment]

Figure 6:
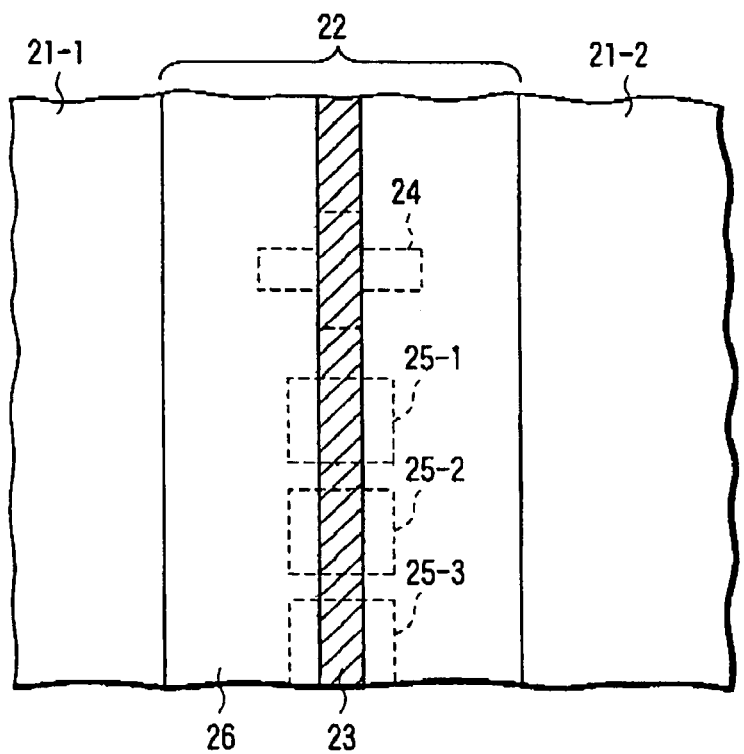
FIG. 6 is an enlarged pattern plan view showing two chips formed close to each other in a semiconductor wafer and a region between the two chips, for illustrating a semiconductor device and a manufacturing method thereof according to a fourth embodiment of the present invention.

FIG. 6 shows two chips (semiconductor chips) 21-1, 21-2 which are formed close to each other in a semiconductor wafer and a region 22 between the two chips 21-1 and 21-2 in an enlarged form, for illustrating a semiconductor device and a manufacturing method thereof according to a fourth embodiment of the present invention. In the fourth embodiment, a polyimide film (which is formed of a polyimide-series material or is a laser beam absorbing film of the same kind) 26 is formed in a region 22.

Generally, in a semiconductor device with respect to which blade dicing is performed, the polyimide film on the region 22 is previously selectively removed in order to prevent generation of cutting chips and separation of a surface protection film of polyimide formed on the element region. However, in the fourth embodiment, the polyimide film 26 formed on the element region is intentionally formed to extend over the region 22.

With the above configuration and manufacturing method, the polyimide film (formed of a polyimide material or a material of the same kind) is apparently observed non-uniform since the underlying layer is transparent. However, since it absorbs the laser beam, a cutting process can be uniformly performed and the cutting property in the laser dicing step can be improved. Further, since the polyimide film is formed by extending a film used as a surface protection film of the element region, the manufacturing process will not be complicated and the manufacturing cost will not rise.

In the above explanation, the polyimide film (which is formed of a polyimide-series material or is a laser beam absorbing film of the same kind) 26 is formed on the entire surface of the region 22 between the chips 21-1 and 21-2. However, it is also possible to selectively arrange the film only on the laser application region, that is, laser dicing region 23.

[Fifth Embodiment]

Figure 7:
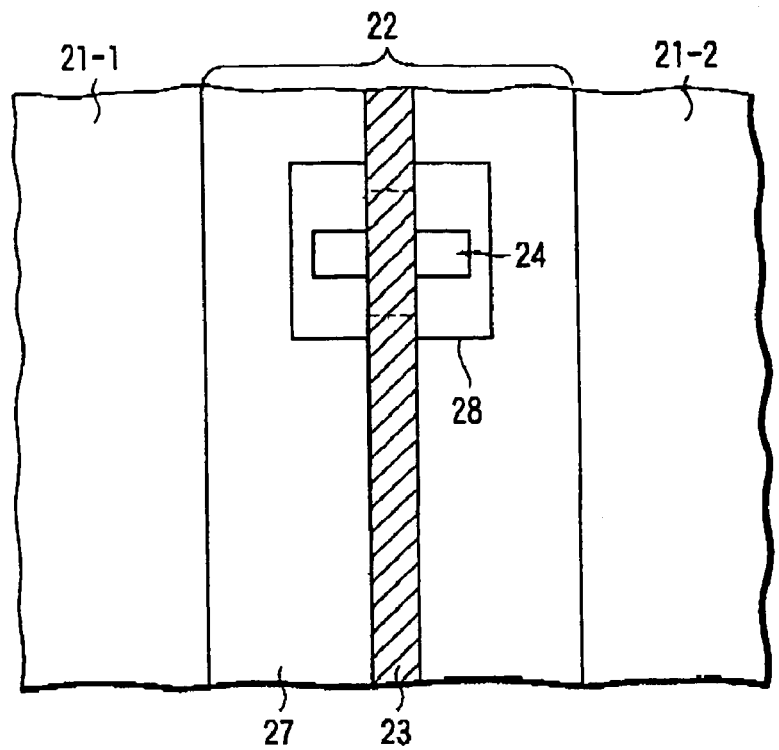
FIG. 7 is an enlarged pattern plan view showing two chips formed close to each other in a semiconductor wafer and a region between the two chips, for illustrating a semiconductor device and a manufacturing method thereof according to a fifth embodiment of the present invention.

FIG. 7 shows two chips. (semiconductor chips) 21-1, 21-2 which are formed close to each other in a semiconductor wafer and a region 22 between the two chips 21-1 and 21-2 in an enlarged form, for illustrating a semiconductor device and a manufacturing method thereof according to a fifth embodiment of the present invention. In the fifth embodiment, a sheet-Like film (laser absorbing member) 27 which absorbs a laser beam is closely attached to and formed on the region 22.

Laser dicing is performed with respect to the semiconductor wafer together with the above film.

With the above configuration and manufacturing method, basically the same operation and effect as those of the first to fourth embodiments can be attained.

It is possible to form an opening 28 in a position corresponding to an alignment mark 24 at the time of dicing, if necessary. Further, instead of the sheet-like film 27, a coating film or a film cured after coating a liquid-form material or a film electro-chemically formed can be used. The above film or coating film can be selectively formed on the region 22 or can be formed on the entire surface of the wafer if it is formed of a material which can be removed after the dicing process.

[Sixth Embodiment]

Figure 8:
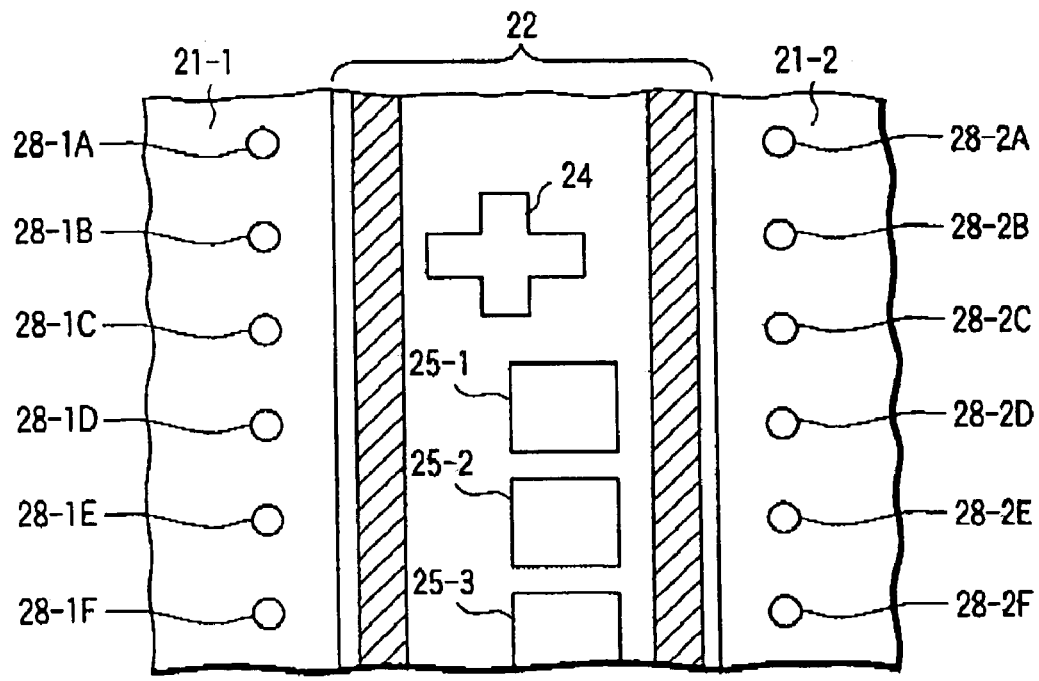
FIG. 8 is an enlarged pattern plan view showing two chips formed close to each other in a semiconductor wafer and a region between the two chips, for illustrating a semiconductor device and a manufacturing method thereof according to a sixth embodiment of the present invention.

FIG. 8 shows two chips (semiconductor chips) 21-1, 21-2 which are formed close to each other in a semiconductor wafer and a region 22 between the two chips 21-1 and 21-2 in an enlarged form, for illustrating a semiconductor device and a manufacturing method thereof according to a sixth embodiment of the present invention. In the sixth embodiment, for example, when bumps 28-1A, 28-1B, . . . , 28-2A, 28-2B, . . . are formed on external electrodes of semiconductor elements formed in the element regions of the chips 21-1, 21-2, barrier metal layers provided between the bumps 28-1A, 28-1B, . . . 28-2A, 28-2B, and the external electrodes o,f the semiconductor elements are arranged on laser dicing regions 23-1, 23-2.

With the above configuration and manufacturing method, basically the same operation and effect as those of the first to fourth embodiments can be attained.

In FIG. 8, a case wherein the arrangement of the laser dicing region is the same as that shown in FIG. 3 is explained as an example, but the arrangement as shown in FIG. 4 or 5 can be applied in the same manner.

[Seventh Embodiment]

Figure 9:
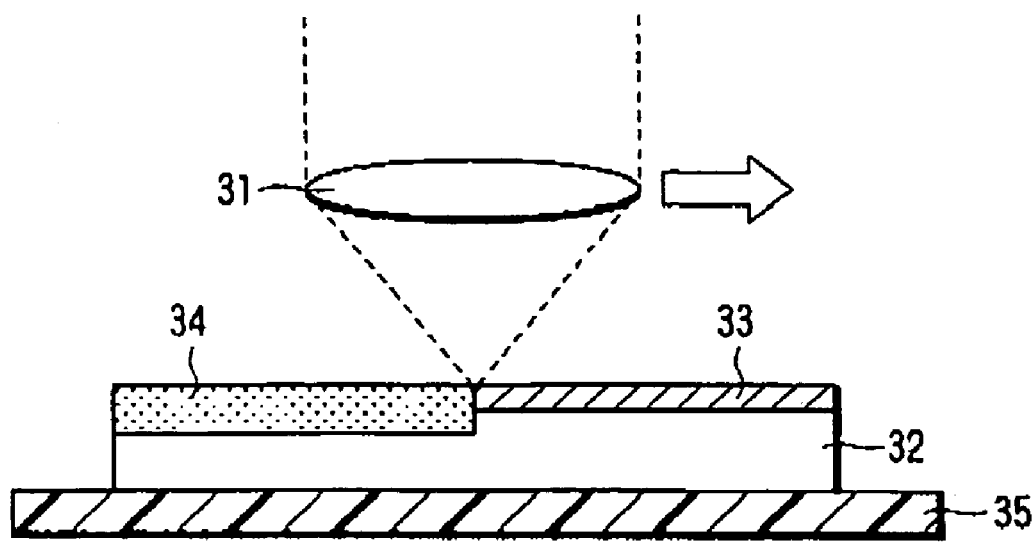
FIG. 9 is a cross sectional view showing a first step of laser dicing, for illustrating a semiconductor device and a manufacturing method thereof according to a seventh embodiment of the present invention.
Figure 10:
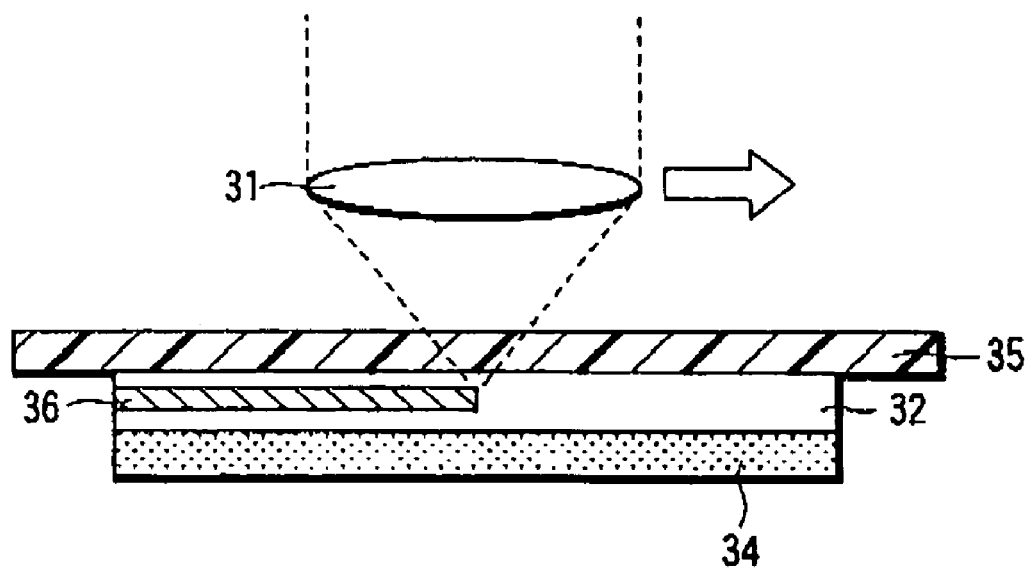
FIG. 10 is a cross sectional view showing a second step of laser dicing, for illustrating the semiconductor device and the manufacturing method thereof according to the seventh embodiment of the present invention.

FIGS. 9 and 10 show a laser dicing step, for illustrating a semiconductor device and a manufacturing method thereof according to a seventh embodiment of the present invention. The laser dicing step according to the seventh embodiment can be applied to any one of the laser dicing steps in the first to sixth embodiments.

First, as shown in FIG. 9, the rear surface of a semiconductor wafer 32 is affixed to a dicing film 35 in order to make a cut in the front surface layer of the wafer 32. Then, the focusing position of a laser beam is set on the uppermost layer (or on the front surface layer side) by use of a lens (condenser lens) 31 and the laser beam is applied to a dicing region 33 on the element region side to make an extremely shallow cut and thus form a cut region 34. The dicing region 33 corresponds to one of the laser dicing regions 23-1, 23-2 and 23 in the first to sixth embodiments and the laser beam is applied to a portion other than the alignment mark and test pads.

After formation of the cut region 34, as shown in FIG. 10, the focusing position of the laser beam is set on the internal portion (on the deep layer side) of the wafer 32 and the laser beam is applied to the wafer 32 from the rear surface side of the wafer 32 via the dicing film 35 to form a melt processing region 36 due to multiphoton absorption along the cut region 34. Then, the wafer is discretely divided.

Thus, by separately performing the laser dicing process twice for the surface layer side and for the deep layer side, since laser power when the cut region 34 is formed is used to make a cut only in the surface layer portion and can be made relatively low, a cut by the laser beam is small and a region required for dicing can be made relatively small. Further, since laser power used when the melt processing region 36 is formed can also be made low, unexpected destruction such as separation of the insulating film and layer-layer separation of the wiring layers occurring at the time of dividing can be suppressed.

When carrying out the laser dicing step twice for the surface layer side and for the deep layer side, it is possible to use two laser dicing devices or one laser dicing device which can be used for both of the steps.

[Eighth Embodiment]

Figure 11:
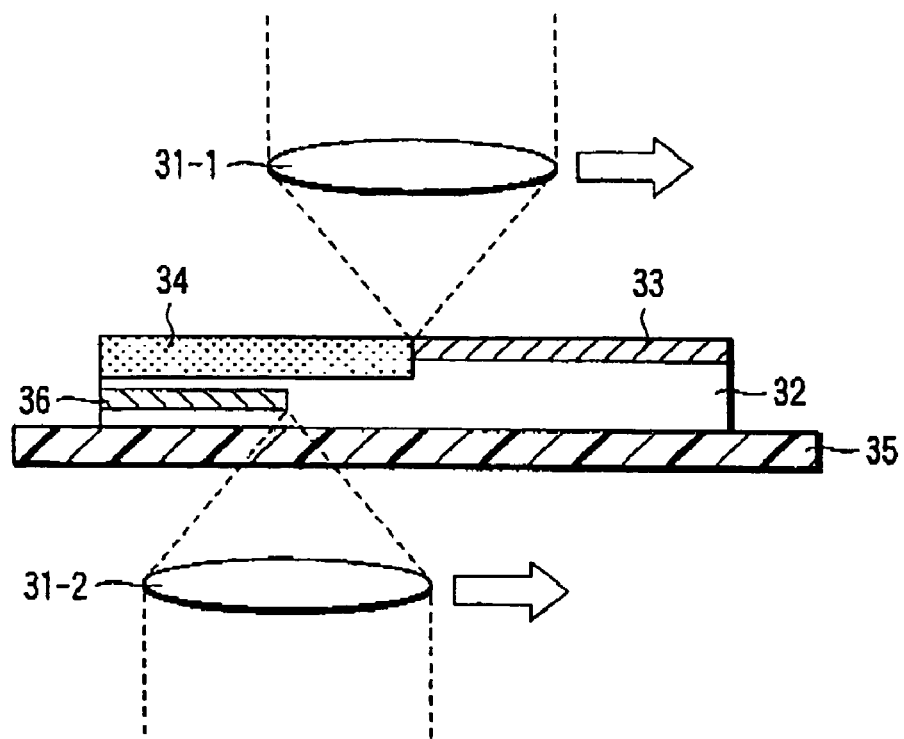
FIG. 11 is a cross sectional view showing a laser dicing step, for illustrating a semiconductor device and a manufacturing method thereof according to an eighth embodiment of the present invention.

FIG. 11 shows a laser dicing step, for illustrating a semiconductor device and a manufacturing method thereof according to an eighth embodiment of the present invention. In the eighth embodiment, the dicing process which is performed in two steps in the seventh embodiment is performed in one step. That is, the focusing position of a laser beam is set on the uppermost layer (front surface layer side) by use of a lens (condenser lens) 31-1 and the laser beam is applied from the element forming surface side of a wafer 32, and at the same time, the focusing position of a laser beam is set on the internal portion (deep layer side) of the wafer 32 by use of a lens (condenser lens) 31-2 and the laser beam is applied thereto from the rear surface side of the wafer 32 via a dicing film 35. Thus, a cut region 34 and melt processing region 36 due to multiphoton absorption are formed substantially at the same time and then the wafer is discretely divided.

With the above configuration and manufacturing method, substantially the same operation and effect as those of the seventh embodiment can be attained.

Although metal wiring layers, polyimide films or laser absorption members are not formed on the rear surface side of the wafer 32, the quality of the finished product will not vary since no semiconductor elements are present on the rear surface side and the surface state is uniform. Further, substantially no influence is given to the element region even if laser beam power is increased to some extent.

[Ninth Embodiment]

Figure 12:
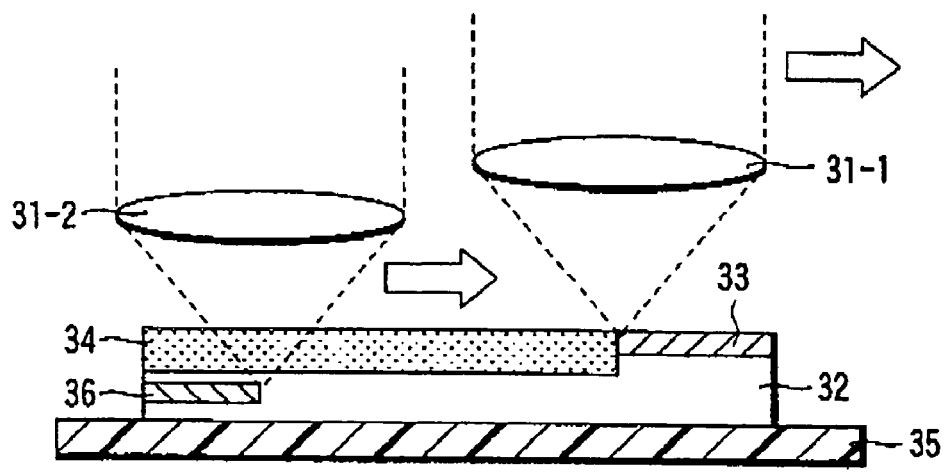
FIG. 12 is a cross sectional view showing a laser dicing step, for illustrating a semiconductor device and a manufacturing method thereof according to a ninth embodiment of the present invention.

FIG. 12 shows a laser dicing step, for illustrating a semiconductor device and a manufacturing method thereof according to a ninth embodiment of the present invention. In the ninth embodiment, the dicing process which is performed in two steps in the seventh embodiment is performed in one step. That is, the focusing position of a laser beam is set on the uppermost layer (front surface layer side) by use of a lens (condenser lens) 31-1 and the laser beam is applied from the element forming surface side of a wafer 32, and at the same time, the focusing position of a laser beam is set on the internal portion (deep layer side) of the wafer 32 by use of a lens (condenser lens) 31-2 and the laser beam is applied thereto. Thus, a cut region 34 and melt processing region 36 due to multiphoton absorption are formed substantially at the same time and then the wafer is discretely divided.

With the above configuration and manufacturing method, substantially the same operation and effect as those of the seventh and eighth embodiments can be attained.

In the seventh to ninth embodiments, a case wherein the wafer is divided only by laser dicing is explained as an example, but the laser dicing process can be performed not to completely divide the wafer and then the wafer 32 can be divided into discrete chips by cracking or stretching a dicing film 35.

Further, the laser dicing process is performed as trimming and the wafer can be finally divided by normal blade dicing.

As described above, according to one aspect of this invention, a semiconductor device with high quality can be attained.

Further, a semiconductor device manufacturing method which can improve the cutting property in the laser dicing step and the manufacturing yield can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of manufacturing a semiconductor device comprising:
    applying a laser beam to a semiconductor wafer except an alignment mark and testing pads formed in each region between semiconductor chips of the semiconductor wafer, and
    dividing the semiconductor wafer into discrete semiconductor chips.

2. A method of manufacturing a semiconductor device comprising:
    focusing a laser beam on a front surface layer side of a dicing line region,
    applying a laser beam to a semiconductor wafer except an alignment mark and testing pads formed in each region between semiconductor chips to form a cut region shallower than thickness of the semiconductor wafer,
    focusing a laser beam on a deep layer side of the semiconductor wafer corresponding in position to the cut region,
    applying a laser beam to the semiconductor wafer except the alignment mark and testing pads formed in each region between the semiconductor chips to form a melt processing region due to multiphoton absorption in the semiconductor wafer, and
    dividing the semiconductor wafer into discrete semiconductor chips.

3. The semiconductor device manufacturing method according to claim 2, wherein forming the melt processing region is to apply the laser beam from a rear surface side of the semiconductor wafer via a dicing film.

4. The semiconductor device manufacturing method according to claim 2, wherein forming the melt processing region is to apply the laser beam from an element region side of the semiconductor wafer.

5. The semiconductor device manufacturing method according to claim 2, wherein the laser beam is applied to the region between the semiconductor chips in a straight form.

6. The semiconductor device manufacturing method according to claim 2, wherein the laser beam is applied to the region between the semiconductor chips in a bent form.

7. A method of manufacturing a semiconductor device comprising:
    applying a laser beam focused on a front surface layer side of a dicing line region to a semiconductor wafer except an alignment mark and testing pads formed in each region between semiconductor chips of the semiconductor wafer and applying a laser beam focused on an internal portion of the semiconductor wafer to the semiconductor wafer except the alignment mark and testing pads formed in each region between the semiconductor chips of the semiconductor wafer to form a cut region on the front surface layer side of the semiconductor wafer and a melt processing region due to multiphoton absorption on the deep layer side of the semiconductor wafer, and
    dividing the semiconductor wafer into discrete semiconductor chips.

8. The semiconductor device manufacturing method according to claim 7, wherein the laser beam is applied to the region between the semiconductor chips in a straight form.

9. The semiconductor device manufacturing method according to claim 7, wherein the laser beam is applied to the region between the semiconductor chips in a bent form.

* * * * *